US010941318B2

(12) United States Patent
Taguchi et al.

(10) Patent No.: US 10,941,318 B2
(45) Date of Patent: *Mar. 9, 2021

(54) METHOD FOR PRODUCING CATIONICALLY MODIFIED SILICA, CATIONICALLY MODIFIED SILICA DISPERSION, METHOD FOR PRODUCING POLISHING COMPOSITION USING CATIONICALLY MODIFIED SILICA, AND POLISHING COMPOSITION USING CATIONICALLY MODIFIED SILICA

(71) Applicant: FUJIMI INCORPORATED, Kiyosu (JP)

(72) Inventors: Souma Taguchi, Kiyosu (JP); Keiji Ashitaka, Kiyosu (JP); Naoya Miwa, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/338,002

(22) PCT Filed: Sep. 5, 2017

(86) PCT No.: PCT/JP2017/031956
§ 371 (c)(1),
(2) Date: Mar. 29, 2019

(87) PCT Pub. No.: WO2018/061656
PCT Pub. Date: Apr. 5, 2018

(65) Prior Publication Data
US 2019/0233678 A1  Aug. 1, 2019

(30) Foreign Application Priority Data

Sep. 30, 2016 (JP) .............................. JP2016-193604

(51) Int. Cl.
| | | |
|---|---|---|
| *C09G 1/02* | (2006.01) | |
| *C01B 33/146* | (2006.01) | |
| *C09K 3/14* | (2006.01) | |
| *H01L 21/304* | (2006.01) | |
| *B24B 37/00* | (2012.01) | |
| *H01L 21/321* | (2006.01) | |
| *H01L 21/306* | (2006.01) | |
| *H01L 21/3105* | (2006.01) | |
| *B24B 37/04* | (2012.01) | |

(52) U.S. Cl.
CPC ............... *C09G 1/02* (2013.01); *B24B 37/00* (2013.01); *C01B 33/146* (2013.01); *C09K 3/1436* (2013.01); *H01L 21/304* (2013.01); *B24B 37/044* (2013.01); *H01L 21/30625* (2013.01); *H01L 21/31055* (2013.01); *H01L 21/3212* (2013.01)

(58) Field of Classification Search
None
See application file for complete search history.

(56) References Cited

U.S. PATENT DOCUMENTS

| | | | | |
|---|---|---|---|---|
| 2003/0181566 A1* | 9/2003 | Chapman | ................. | C08K 9/02 524/492 |
| 2005/0079718 A1* | 4/2005 | Siddiqui | ................. | C09G 1/02 438/692 |
| 2010/0181525 A1 | 7/2010 | Belmont | | |
| 2015/0132955 A1* | 5/2015 | Yamato | ............. | H01L 21/31053 438/692 |
| 2016/0096979 A1* | 4/2016 | Lan | ........................ | C09G 1/02 216/52 |
| 2017/0362465 A1 | 12/2017 | Ashitaka | | |
| 2018/0344641 A1* | 12/2018 | Brinker | ................ | A61K 9/1271 |

FOREIGN PATENT DOCUMENTS

| | | |
|---|---|---|
| JP | S63-182204 A | 7/1988 |
| JP | 2005-162533 A | 6/2005 |
| JP | 2008-280229 A | 11/2008 |

(Continued)

OTHER PUBLICATIONS

Weichold et al ("A comparative study on the dispersion stability of aminofunctionalized silica nanoparticles made from sodium silicate" Journal of Colloid and Interface Science, 2008, 324, 105-109). (Year: 2008).*
Non-Final Office Action on U.S. Appl. No. 16/089,945 dated Feb. 7, 2020.
Majewski et al. "Surface properties and water treatment capacity of surface engineered silica coated with 3-(2-aminoethyl) aminopropyltrimethoxysilane" Applied Surface Science, 2012, 258, 2454-2458. (Year: 2012).
Office Action received in corresponding Taiwanese Patent Application No. 106110856 dated Jun. 12, 2020 with English translation.
Final Office Action on U.S. Appl. No. 16/089,945 dated Jun. 29, 2020.

(Continued)

*Primary Examiner* — Shamim Ahmed
(74) *Attorney, Agent, or Firm* — Foley & Lardner LLP

(57) ABSTRACT

To provide a means capable of suppressing the generation of gelation at the time of or after the addition of a silane coupling agent in the production of a cationically modified silica including modifying a silica raw material with a silane coupling agent. The present invention is a method for producing a cationically modified silica, including: mixing a silica raw material having a negative zeta potential with a silane coupling agent having an amino group or a quaternary cationic group; and reacting the silica raw material with the silane coupling agent to obtain a cationically modified silica, in which
the cationically modified silica satisfies the following relational expression (1):

$$X<Y \qquad \text{relational expression (1)}$$

in the relational expression (1), X is a pH value at which an isoelectric point is shown in the cationically modified silica, and Y is a pH value of the cationically modified silica.

14 Claims, No Drawings

(56) References Cited

FOREIGN PATENT DOCUMENTS

| JP | 2009-274923 | * 11/2009 |
| JP | 2009-274923 A | 11/2009 |
| JP | 2010-269985 A | 12/2010 |
| JP | 2011-225381 A | 11/2011 |
| JP | 2016-008157 A | 1/2016 |
| TW | 201031739 A | 9/2010 |
| WO | WO-2016/117560 A | 7/2016 |

OTHER PUBLICATIONS

Office Action issued in Japanese Patent Application No. 2018-508132 dated Jun. 30, 2020 with English translation.

Pham et al. "Surface Charge Modification of Nano-Sized Silica Colloid", Aust. J. Chem. 2007, vol. 60, 662-666.

Kneuer et al., "Silica nanoparticles modified with aminosilanes as carriers for plasmid DNA" International Journal of Pharmaceutics, vol. 196 (2000), Year 2000, pp. 257-261.

Lee et al., "Preparation and characterization of surface modified silica nanoparticles with organo-silane compounds", Colloids and Surfaces A: Physicochemical and Engineering Aspects, vol. 384 (2011), Year 2011, pp. 318-322.

Rostami et al., "Investigating the effect of pH on the surface chemistry of an amino silane treated nano silica", Pigment & Resin Technology, 2011, 12 Pages.

U.S. Office Action on U.S. Appl. No. 16/089,945 dated Nov. 27, 2020.

* cited by examiner

METHOD FOR PRODUCING CATIONICALLY MODIFIED SILICA, CATIONICALLY MODIFIED SILICA DISPERSION, METHOD FOR PRODUCING POLISHING COMPOSITION USING CATIONICALLY MODIFIED SILICA, AND POLISHING COMPOSITION USING CATIONICALLY MODIFIED SILICA

TECHNICAL FIELD

The present invention relates to a method for producing a cationically modified silica, a cationically modified silica dispersion, a method for producing a polishing composition using a cationically modified silica, and a polishing composition using a cationically modified silica.

BACKGROUND ART

In a semiconductor device production process, as the performance of a semiconductor device is improved, a technique to produce the wiring with higher density and higher integration is required. In the production process of such a semiconductor device, CMP (chemical mechanical polishing) is an essential process. As the miniaturization of a semiconductor circuit progresses, the flatness required for the unevenness of a pattern wafer is high, and it is also required to realize high smoothness of nano order by CMP. In order to realize the high smoothness by CMP, it is preferred that the convex part of a pattern wafer be polished at a high polishing speed, while the concave part is not much polished.

In this regard, when CMP is performed, it is common to use a composition (polishing composition) containing various kinds of additive agents such as a polishing accelerator, and a pH adjusting agent, in addition to a polishing agent called abrasive grains. In this regard, the abrasive grains (polishing agent) are particles having a function of adhering to a surface of the object to be polished and scraping off the surface by physical action. In addition, as a raw material of the abrasive grains (polishing agent) for producing a polishing composition, in general, a silica dispersion such as a colloidal silica having silica (silicon oxide: $SiO_2$) particles, which can be abrasive grains (polishing agent), as a dispersoid is used.

It is known that in this silica dispersion, silica particles aggregate under the acidic condition, and the silica dispersion is inferior in the stability, and thus it has been conventionally required to have a silica dispersion excellent in the stability in a wide pH range.

In this regard, as a colloidal silica having improved stability under the acidic condition, for example, a colloidal silica obtained by treating an aqueous colloidal silica with an aqueous solution of basic aluminum chloride, a colloidal silica obtained by treating an aqueous colloidal silica with an aqueous solution of a basic aluminum salt, and then by performing a stabilizing treatment with water-soluble organic aliphatic polycarboxylic acid, and the like are known.

However, although the stability under the acidic condition has been improved by these colloidal silicas, the content of metallic impurities is large, and thus there is a problem that these colloidal silicas cannot be used for the application requiring the high purity, as the abrasive grains (polishing agent) for polishing, for example, a semiconductor wafer or the like.

As the technique for reducing the contamination amount of such metal impurities, in JP 2005-162533 A, there is a disclosure of a technique for producing a modified colloidal silica by modifying the colloidal silica that has been produced by hydrolyzing a hydrolyzable silicon compound, with the use of a modifier such as a silane coupling agent. According to JP 2005-162533 A, it is described that by the technique as described above, a modified colloidal silica that can be stably dispersed for a long period of time without causing aggregation or gelation of colloidal silica even if the dispersing medium is acidic, and further has an extremely small content of metal impurities and has high purity is obtained. In addition, in JP 2005-162533 A, there is also a disclosure that from the viewpoint of rapidly forming a colloidal silica, the pH of a reaction solvent is preferably adjusted to pH 8 to 11 (more preferably pH 8.5 to 10.5). Meanwhile, there is not a disclosure at all of controlling the zeta potential of silica particles before reaction.

Further, as a technique of using a coupling agent, as with JP 2005-162533 A, JP S63-182204 A discloses a technique in which a coupling agent is added into an alcoholic solution suspension of hydrate fine particles of an inorganic oxide such as silica, titania, zirconia, and alumina, to perform a coupling treatment, and then a single dispersion of an organic solvent of oxide fine particles is produced by replacing an alcoholic solvent with an organic solvent. According to the description in JP S63-182204 A, surface modification can be performed while preventing the generation of aggregate particles during a process, and a stable dispersion can be produced even when the concentration of fine particles is high. However, also in JP S63-182204 A, there is not a disclosure at all of controlling the zeta potential of the alcoholic solution suspension of hydrate fine particles of an inorganic oxide before reaction.

SUMMARY OF INVENTION

When investigated the techniques described in JP 2005-162533 A and JP S63-182204 A, the present inventors have found that there still remains a problem to be improved in these techniques. That is, it has been found that there may be a case where gelation is generated at the time of or after the addition of a silane coupling agent when a cationically modified silica dispersion is produced by using these techniques. Further, it has been found that there may be a case where precipitation is generated also when a polishing composition is produced by using a cationically modified silica dispersion.

Therefore, an object of the present invention is to provide a means capable of suppressing the generation of gelation at the time of or after the addition of a silane coupling agent in the production of a cationically modified silica including modifying a silica raw material with a silane coupling agent. Further, an object of the present invention is also to provide a means capable of suppressing the generation of precipitation at the time of the production or after the production of a polishing composition containing a cationically modified silica and a dispersing medium, including modifying a silica raw material with a silane coupling agent.

The present inventors carried out intensive studies to solve the problem described above. As a result, according to a first embodiment of the present invention, there is provided a method for producing a cationically modified silica, including: mixing a silica raw material having a negative zeta potential with a silane coupling agent having an amino group or a quaternary cationic group; and reacting the silica raw material with the silane coupling agent to obtain a cationically modified silica, in which the cationically modified silica satisfies the following relational expression (1):

[Mathematical formula 1]

$$X<Y \qquad \text{relational expression (1)}$$

in the formula (1), X is a pH value at which an isoelectric point is shown in a cationically modified silica, and Y is a pH value of a cationically modified silica.

According to a second embodiment of the present invention, there is provided a cationically modified silica dispersion, being obtained by mixing a silica raw material having a negative zeta potential with a silane coupling agent having an amino group or a quaternary cationic group; and reacting the silica raw material with the silane coupling agent, in which the cationically modified silica satisfies the following relational expression (1):

[Mathematical formula 2]

$$X<Y \qquad \text{relational expression (1)}$$

in the formula (1), X is a pH value at which an isoelectric point is shown in a cationically modified silica, and Y is a pH value of a cationically modified silica.

According to a third embodiment of the present invention, there is provided a method for producing a polishing composition containing a cationically modified silica and a dispersing medium, including: preparing the cationically modified silica by mixing a silica raw material having a negative zeta potential with a silane coupling agent having an amino group or a quaternary cationic group, and reacting the silica raw material with the silane coupling agent; and then mixing the cationically modified silica and the dispersing medium, in which the cationically modified silica and the polishing composition satisfy the following relational expression (2):

[Mathematical formula 3]

$$Z<X<Y \qquad \text{relational expression (2)}$$

in the relational expression (2), X is a pH value at which an isoelectric point is shown in a cationically modified silica, Y is a pH value of a cationically modified silica, and Z is a pH value of a polishing composition.

According to a fourth embodiment of the present invention, there is provided a polishing composition, including: a cationically modified silica obtained by mixing a silica raw material having a negative zeta potential with a silane coupling agent having an amino group or a quaternary cationic group, and reacting the silica raw material with the silane coupling agent; and a dispersing medium, in which the cationically modified silica and the polishing composition satisfy the following relational expression (2):

[Mathematical formula 4]

$$Z<X<Y \qquad \text{relational expression (2)}$$

in the relational expression (2), X is a pH value at which an isoelectric point is shown in a cationically modified silica, Y is a pH value of a cationically modified silica, and Z is a pH value of a polishing composition.

DESCRIPTION OF EMBODIMENTS

Hereinafter, the present invention will be described. Note that the present invention is not limited only to the following embodiments. Further, in the present specification, the expression "X to Y" showing a range means "X or more and Y or less". In addition, unless otherwise noted, operations and measurements of physical properties and the like are performed under the conditions of room temperature (20 to 25° C.) and a relative humidity of 40 to 50% RH.

First Embodiment

A first embodiment of the present invention is a method for producing a cationically modified silica, including: mixing a silica raw material having a negative zeta potential with a silane coupling agent having an amino group or a quaternary cationic group; and reacting the silica raw material with the silane coupling agent to obtain a cationically modified silica, in which the cationically modified silica satisfies the following relational expression (1):

[Mathematical formula 5]

$$X<Y \qquad \text{relational expression (1)}$$

in the formula (1), X is a pH value at which an isoelectric point is shown in a cationically modified silica, and Y is a pH value of a cationically modified silica. By having such a constitution, the generation of gelation can be suppressed at the time of or after the addition of a silane coupling agent.

In the present specification, the expression "cationically modified silica" means a state that a cationic group (amino group or quaternary cationic group) as a modifying group is introduced to a surface of a silica particle.

[Silica Raw Material]

A silica raw material is a raw material before cationic modification (modification) with the use of a predetermined silane coupling agent to be described later, and contains silica particles. The silica raw material is preferably a colloidal silica (hereinafter, the colloidal silica as a silica raw material is also referred to as a "raw material colloidal silica", and a case where the silica raw material is a raw material colloidal silica will be described in detail as an example).

The raw material colloidal silica can be, for example, a raw material colloidal silica produced by a sol-gel method. The raw material colloidal silica produced by a sol-gel method has a less content of diffusible metal impurities or corrosive ions such as chloride ions in a semiconductor, and therefore, this is preferred. The production of a raw material colloidal silica by a sol-gel method can be performed by using a conventionally known technique, and specifically, a raw material colloidal silica can be obtained by performing hydrolysis and condensation reaction using a hydrolyzable silicon compound (for example, an alkoxysilane or a derivative thereof) as a raw material. As the silicon compound, only one kind may be used alone, or two or more kinds may be used in combination. Further, the raw material colloidal silica may be produced by a method other than the sol-gel method.

In one embodiment, the above-described silicon compound is preferably an alkoxysilane or a derivative thereof, represented by the following general formula (1).

[Chemical formula 1]

$$Si(OR)_4 \qquad (1)$$

In the general formula (1), R is an alkyl group, preferably a lower alkyl group having 1 to 8 carbon atoms, and more preferably a lower alkyl group having 1 to 4 carbon atoms. In this regard, examples of the R include a methyl group, an ethyl group, a propyl group, an isopropyl group, a butyl group, a pentyl group, a hexyl group, and the like, and tetramethoxysilane in which R is a methyl group, tetraethoxysilane in which R is an ethyl group, and tetraisopropoxysilane in which R is an isopropyl group are preferred. Further, as the derivative of an alkoxysilane, a low condensate that is obtained by partially hydrolyzing an alkoxysilane is mentioned. In the present invention, it is preferred to use tetramethoxysilane from the point that it is easy to control the hydrolysis rate, the point that it is easy to obtain fine silica particles of single-digit nm, and the point that unreacted residues are less.

The above-described silicon compound is hydrolyzed and condensed in a reaction solvent to turn into a colloidal silica. As the reaction solvent, water or an organic solvent containing water can be used. Examples of the organic solvent include a hydrophilic organic solvent, for example, alcohols such as methanol, ethanol, isopropanol, n-butanol, t-butanol, pentanol, ethylene glycol, propylene glycol, and 1,4-butanediol; and ketones such as acetone, and methyl ethyl ketone. Among these organic solvents, in particular, it is preferred to use alcohols such as methanol, ethanol, and isopropanol, and from the viewpoint of the post-processing or the like of the reaction solvent, it is more preferred to use alcohols having the same alkyl group as the alkyl group (R) of the silicon compound that is a raw material (for example, methanol to tetramethoxysilane). These organic solvents may be used singly alone, or may also be used in combination of two or more kinds thereof. The use amount of the organic solvent is not particularly limited, and is preferably around 5 to 50 mol per mole of the silicon compound. When the use amount is 5 mol or more, the sufficient compatibility with the silicon compound is ensured, and when the use amount is 50 mol or less, the decrease in the production efficiency is suppressed. The amount of the water to be added into the organic solvent is not particularly limited as long as the amount required for the hydrolysis of the silicon compound is ensured, and is preferably around 2 to 15 mol per mole of the silicon compound. In addition, the amount of the water to be mixed in the organic solvent largely affects the particle size of the colloidal silica particle to be formed. By increasing the amount of the water to be added, the particle size of the colloidal silica particle can be increased. Further, by decreasing the amount of the water to be added, the particle size of the colloidal silica particle can be reduced. Accordingly, by changing the mixing ratio of the water and the organic solvent, the particle size of the colloidal silica particle to be produced can be arbitrarily adjusted.

It is preferred to adjust a reaction solvent to alkaline by adding a basic catalyst to the reaction solvent of hydrolysis condensation reaction of the silicon compound to obtain a colloidal silica (Stober method). In this way, the reaction solvent is adjusted to preferably pH 8 to 11, and more preferably pH 8.5 to 10.5, and the colloidal silica can be rapidly formed. As the basic catalyst, organic amine or ammonia is preferred from the viewpoint of preventing the contamination of impurities, and in particular, ethylenediamine, diethylenetriamine, triethylenetetramine, ammonia, urea, ethanol amine, tetramethylammonium hydroxide, or the like can be preferably mentioned.

In order to hydrolyze and condense a silicon compound in a reaction solvent, the silicon compound that is a raw material may be added into an organic solvent, and the resultant mixture may be stirred under the temperature condition of 0 to 100° C., and preferably 0 to 50° C. By hydrolyzing and condensing the silicon compound while stirring the silicon compound in an organic solvent containing water, colloidal silica particles having a uniform particle size can be obtained.

The silica particles contained in a silica raw material are usually present in a form of a secondary particle that is an aggregate of primary particles. Further, the average particle size (average secondary particle size) of the secondary particles is not particularly limited, and preferably 10 to 500 nm, more preferably 15 to 200 nm, and furthermore preferably 20 to 100 nm. If the average secondary particle size is 10 nm or more, the dispersibility is sufficiently secured even if the concentration of the silica particles is high, and meanwhile, if the average secondary particle size is 500 nm or less, the generation of precipitation is prevented. Note that as the value of the average secondary particle size, as described in the column of Examples to be described later, a value measured as a volume average particle size by a dynamic light scattering method using a particle size distribution measuring device (UPA-UT151, manufactured by NIKKISO CO., LTD.) is adopted.

In addition, the lower limit of the average primary particle size of the silica particles contained in the silica raw material is preferably 5 nm or more, more preferably 7 nm or more, and furthermore preferably 10 nm or more. Further, the upper limit of the average primary particle size of silica particles is preferably 500 nm or less, more preferably 200 nm or less, and furthermore preferably 100 nm or less. In this regard, as described in the column of Examples to be described later, the diameter (primary particle size of silica particles) of silica particles (primary particles) can be calculated by using the formula of $SA=4\pi R^2$, assuming that the shape of the silica particle is a perfect sphere, on the basis of the specific surface area (SA) of the silica particle calculated by a BET method. In this regard, the value of the degree of association (average secondary particle size/average primary particle size) calculated from these values is not particularly limited, and preferably around 1.0 to 5.0.

The concentration of silica particles in a silica raw material is not particularly limited as long as it is adjusted depending on the purpose of using the silica, and from the viewpoint of the productivity, the concentration is preferably 5% by mass or more, more preferably 10 to 60% by mass, and furthermore preferably 10 to 50% by mass. Meanwhile, in a silica raw material, the remainder excluding the content of the silica is water or the like as a dispersing medium, an extremely minute amount of catalyst, and the like. In consideration of the range of the concentration of silica particles described above, the concentration of the dispersing medium in a silica raw material is preferably 95% by mass or less, more preferably 40 to 90% by mass, and furthermore preferably 50 to 90% by mass. Further, the smaller the content of an organic solvent in a dispersing medium is, the more preferable the content is, as described above, and from this point of view, the proportion of the content of water when the total amount of the dispersing medium is taken as 100% by mass is preferably 90% by mass or more, more preferably 95% by mass or more, furthermore preferably 98% by mass or more, and particularly preferably 100% by mass. In this regard, in a case where the dispersing medium contains an organic solvent, as such an organic solvent, for example, the above-described organic solvents such as methanol, ethanol, and isopropanol are mentioned. Among them, it is preferred to use the same kind of alcohol as the alcohol to be generated by the hydrolysis of the above-described silicon compound. This is because by using the same kind of alcohol as the alcohol to be generated by the hydrolysis of the silicon compound, the recovery and reuse of the solvent can be facilitated.

In the production method of the present embodiment, as the silica raw material, a silica raw material having a negative zeta potential is used. The specific value of the zeta potential indicated by a silica raw material is not particularly limited, and as the value immediately before the reaction with the silane coupling agent to be described later, the specific value is preferably −10 mV or less, more preferably −20 mV or less, and furthermore preferably −30 mV or less. In this regard, the lower limit of the value of the zeta potential is not particularly limited, and usually around −60 mV or more. As the value of the zeta potential in the present specification, a value measured by the method described in the column of Examples to be described later is adopted.

If the zeta potential is already a negative value when the silica raw material is prepared and obtained, the silica raw material can be used as it is for the reaction with a silane coupling agent to be described later without applying any special treatment to the silica raw material. Meanwhile, in a case where the value of the zeta potential is zero or more when the silica raw material is prepared and obtained, it is required to adjust the zeta potential of the silica raw material to a negative value before the reaction with a silane coupling agent to be described later. In this regard, in a case where the value of the zeta potential of a silica raw material is zero or more, the method for adjusting the zeta potential of the silica raw material to a negative value is not particularly limited, and examples of the method include a method in which an alkali is added to a silica raw material to dissociate the hydroxyl group (—OH group) present on a surface of the silica particle contained in the silica raw material into a —O$^-$ group and H$^+$ to increase the exposure of —O$^-$; a method in which anion exchange is performed on a silica raw material to dissociate the hydroxyl group (—OH group) present on a surface of the silica particle contained in the silica raw material into a —O$^-$ group and H$^+$ to increase the exposure of —O$^-$; a method in which an anionic group is introduced to a silica raw material, and the like. Among them, from the viewpoint of being excellent in the productivity, a method in which an alkali is added is preferably adopted.

In addition, in the method for producing a modified silica according to the present embodiment, the pH of the silica raw material to be used for the reaction is determined as a result of the control of zeta potential as described above, and therefore, it is difficult to uniquely specify the preferable range, and the pH is usually around 5 to 11, preferably 6 to 10.5, and more preferably 7 to 10.

Further, if necessary, various kinds of treatment steps may further be applied to the silica raw material prepared in the above. As such a treatment step, for example, a step of reducing the viscosity of a silica raw material is mentioned. As the step of reducing the viscosity of a silica raw material, for example, a step of adding an alkaline solution (aqueous solution of various kinds of bases such as ammonia water) or an organic solvent to a silica raw material can be mentioned. The amount of the alkaline solution or organic solvent to be added at this time is not particularly limited, and may be appropriately set in consideration of the viscosity of a silica raw material to be obtained after the addition. As described above, by performing the step of decreasing the viscosity of a silica raw material, there is an advantage that the initial dispersibility of a silane coupling agent to a silica raw material is improved and the aggregation of silica particles can be suppressed.

[Silane Coupling Agent]

In the method for producing a cationically modified silica according to the present embodiment, the silica raw material (having a negative zeta potential) prepared in the above and a silane coupling agent having an amino group or a quaternary cationic group are mixed. With this mixing, the reaction between (the hydroxyl group present on a surface of) the silica raw material and the hydrolyzable silyl group of the silane coupling agent proceeds. As a result, one end of the silane coupling agent bonds to or adsorbs to the surface of a silica particle contained in the silica raw material, and the other end (amino group or quaternary cationic group) is exposed on the surface of a silica particle on a large scale. As a result, in the cationically modified silica, an improvement in the zeta potential is confirmed as compared with the silica raw material.

Examples of the silane coupling agent to be used at this time include

N-(β-aminoethyl)-γ-aminopropylmethyldimethoxysilane, N-(β-aminoethyl)-γ-aminopropyltrimethoxysilane, N-(β-aminoethyl)-γ-aminopropyltriethoxysilane, γ-aminopropyltriethoxysilane, γ-aminopropyltrimethoxysilane, γ-triethoxysilyl-N-(α,γ-dimethyl-butylidene)propylamine, N-phenyl-γ-aminopropyltrimethoxysilane, a hydrochloride of N-(vinylbenzyl)-β-aminoethyl-γ-aminopropyltriethoxysilane, octadecyl dimethyl-(γ-trimethoxysilylpropyl)-ammonium chloride, and the like. Among them, since the reactivity with a silica raw material is favorable, N-(β-aminoethyl)-γ-aminopropyltrimethoxysilane, N-(β-aminoethyl)-γ-aminopropyltriethoxysilane, γ-aminopropyltriethoxysilane, and γ-aminopropyltrimethoxysilane are preferably used, and γ-aminopropyltriethoxysilane that is a primary amine/ethoxy coupling agent (silane coupling agent having a primary amino group and an ethoxy group) is more preferably used. In addition, in the present invention, as the silane coupling agent, only one kind may be used alone, or two or more kinds may be used in combination.

[Mixing and Reaction of Silica Raw Material and Silane Coupling Agent]

In the production method of the present embodiment, the silane raw material and the silane coupling agent, which have been described above, are mixed, and the silane raw material is reacted with the silane coupling agent. As a result, a cationically modified silica can be obtained due to the introduction of a cationic group as a modifying group to a surface of a silica particle.

In mixing and reaction of the silica raw material and a silane coupling agent having an amino group or a quaternary cationic group, it is preferred to use the silane coupling agent without dilution, or to use the silane coupling agent in a state of a solution having a concentration of 5% by mass or more (water dispersion). Herein, if the expression "adding without dilution" is regarded as adding at a concentration of "100% by mass", the concentration of the silane coupling agent to be added is, as described above, preferably 5% by mass or more, more preferably 50% by mass or more, furthermore preferably 95% by mass or more, and particularly preferably 100% by mass (adding without dilution). Further, in a case where the silane coupling agent in a state of a solution is added to the silica raw material, the solvent constituting the solution that contains the silane coupling agent is not particularly limited, and from the viewpoint of preventing the generation of gelation, it is preferred to use a solvent containing no water.

In the production method of the present embodiment, the method for mixing a silica raw material and a silane coupling agent is not particularly limited. From the viewpoint of suppressing the gelation, as the mixing method, a method in which a silane coupling agent is added to a silica raw material is preferred.

In a case where a silane coupling agent is added to a silica raw material, as the addition form, the silane coupling agent may be added all at once, may be divided, or may be added continuously, and it is preferred to add the silane coupling agent dropwise at a constant dropping speed. The dropping speed is also appropriately adjusted depending on the concentration of silica particles, the concentration of the silane coupling agent, or the like, and for example, in a case where the total amount added is around 10 mL, the dropping speed is 1 to 10 mL/min.

With regard to the amount of the silane coupling agent to be added, it is difficult to uniquely define the amount of the silane coupling agent because the optimal addition amount varies depending on the balance between the conditions of the specific surface area of silica particles on the silica raw material side, or the like and the conditions of the molecular weight on the silane coupling agent side, or the like. As an example, the amount of the silane coupling agent to be added is preferably 0.05% by mass or more, and more preferably 0.05 to 20% by mass, relative to 100% by mass of the silica particles contained in the silica raw material.

In the production method of the present embodiment, the temperature in mixing and reaction of a silica raw material and a silane coupling agent is not particularly limited, and is preferably in the range of from a room temperature to a boiling point of a solvent. In the present embodiment, the reaction can proceed even at around room temperature, and therefore, it is preferred that the reaction can be allowed to proceed at a temperature in the vicinity of room temperature (for example, 20 to 35° C.). In other words, in the production method of the present embodiment, it is preferred that a step of heating the reaction system of the silica raw material and the silane coupling agent is not included. Even under the temperature condition in the vicinity of room temperature (15 to 25° C.), there is also an advantage that by the extremely simple operation of stirring the reaction system for several hours, almost all of the added silane coupling agent reacts with the silica particles in the silica raw material, and almost no unreacted coupling agent remains.

By utilizing the advantage, the above-described amount of the silane coupling agent to be added can be appropriately adjusted in consideration of the zeta potential profile required for the cationically modified silica to be obtained.

In addition, the stirring speed is not particularly limited, and is preferably 20 to 800 rpm, and more preferably 50 to 700 rpm, from the viewpoint of the uniform dispersibility.

The reaction time of the silica raw material and the silane coupling agent is not particularly limited, and is preferably 10 minutes to 10 hours, and more preferably 30 minutes to 5 hours. From the viewpoint of allowing the reaction to proceed efficiently, the reaction may be performed while stirring the reaction system. There is no particular limitation on the stirring means and stirring condition to be used at this time, and conventionally known knowledge can be appropriately referred to. Further, with respect to the pressure of the reaction system, the reaction may be performed under any of normal pressure (atmospheric pressure), increased pressure, or reduced pressure, and since the reaction according to the present invention can proceed under normal pressure (under atmospheric pressure), the reaction may be performed under normal pressure (under atmospheric pressure).

In a case where the cationically modified silica obtained in accordance with the above-described method contains any solvent other than water, in order to enhance the long-term storage stability of the cationically modified silica, a dispersing medium mainly containing a reaction solvent may be replaced with water, if necessary. The method for replacing a solvent other than water with water is not particularly limited, and for example, a method in which water is added dropwise by a fixed amount while heating the cationically modified silica can be mentioned. Further, a method in which the cationically modified silica is separated from a solvent other than water by precipitation and separation, centrifugation, or the like, and then is redispersed in water can also be mentioned.

[Cationically Modified Silica]

In the cationically modified silica obtained by the production method of the first embodiment of the present invention, a pH value X at which an isoelectric point is shown in the cationically modified silica and a pH value Y of the cationically modified silica satisfy X<Y (relational expression (1)). In the cationically modified silica according to the present invention, if X=Y, or X>Y, gelation is generated at the time of cationic modification (when mixing a silica raw material with a silane coupling agent), and therefore, this is not preferred.

In this regard, the pH value at which an isoelectric point is shown in the cationically modified silica means a pH value at which the zeta potential of the cationically modified silica becomes zero. Further, the pH of the cationically modified silica means a pH value immediately after the preparation of the cationically modified silica (immediately after the completion of the reaction).

In the present specification, as the pH value at which an isoelectric point is shown in a cationically modified silica and as the pH value of a cationically modified silica, values measured by the method described in the column of Examples to be described later are adopted.

The "zeta ($\zeta$) potential" means a potential difference generating at the interface between the solid and the liquid that are in contact with each other when the solid and the liquid move relatively to each other. If the absolute value of the zeta potential increases, the repulsion between particles becomes strong and the stability of particles becomes high, and as the absolute value of the zeta potential is closer to zero, the particles tend to be more easily aggregated.

In the method for producing a cationically modified silica according to the present embodiment, the silica raw material contains a silica having a negative zeta potential, as described later. In the silica raw material, a large number of hydroxyl groups (—OH groups) are present on a surface of a silica particle, most of the hydroxyl groups (—OH groups) are present as —OH groups under the environment of high acidity (the number of $H^+$ is large: acidic), and the hydroxyl groups dissociate into a —$O^-$ group and $H^+$ under the environment of low acidity (the number of $H^+$ is small: alkaline), and as the exposure of —$O^-$ increases, the absolute value of the zeta potential increases in the negative direction. As described above, since the negative zeta potential increases under the alkaline condition with a high pH, the silica raw material is stable, however, since the zeta potential approaches zero under the acidic condition with a low pH, the silica raw material tends to be easily aggregated and becomes unstable, and thus there has been a problem that gelation is generated.

As described above, since the stability of particles becomes high if the absolute value of the zeta potential increases, it is presumed that a cationically modified silica dispersion having a large positive absolute value of the zeta potential under the acidic condition can be obtained by cationically modifying the surfaces of the silica particles constituting the silica raw material and introducing positive (+) charges, and the technique described in JP 2005-162533 A has been completed on the basis of this presumption.

However, as described above, when trying to produce a cationically modified silica dispersion by using the technique described in JP 2005-162533 A, it has been found that there may be a case where gelation is generated in the middle of the production or after the production.

In this regard, it is considered that by using a silica raw material having a negative zeta potential, the electrostatic repulsion between the silica raw material and a silane coupling agent is suppressed and the introduction of a cationic group to a surface of a silica particle is promoted. Further, it is considered that by adjusting the pH of the silica raw material and the amount of the silane coupling agent to be added, the amount of the cationic groups to be introduced to a surface of a silica particle in the silica raw material can be adjusted. For these considerations, a pH value X at which an isoelectric point is shown in a cationically modified silica and a pH value Y of a cationically modified silica can be controlled, and thus the relationship between the X and Y can be controlled so as to have X<Y (relational expression (1)). That is, it is considered that in the middle of the production or after the production, the X and Y can maintain the relationship of X<Y (relational expression (1)) (the zeta potential does not approach zero), and therefore, the gelation can be suppressed.

The mechanism is based on speculation, and the correct or incorrect does not affect the technical scope of the present invention.

In the production method of the present embodiment, a pH value X at which an isoelectric point is shown in a cationically modified silica and a pH value Y of a cationically modified silica can be appropriately adjusted according to the usage form of the cationically modified silica as long as the X and Y satisfy the relational expression X<Y (relational expression (1)).

The lower limit of X is, for example, 4.5 or more, and preferably 5.0 or more. The upper limit of X is, for example, 10.0 or less, and preferably 9.5 or less.

The lower limit of Y is, for example, 7.0 or more, and preferably 7.5 or more. The upper limit of Y is, for example, 13.0 or less, and preferably 12.0 or less.

Second Embodiment

The second embodiment of the present invention is a cationically modified silica dispersion obtained by mixing a silica raw material having a negative zeta potential with a silane coupling agent having an amino group or a quaternary cationic group, and reacting the silica raw material with the silane coupling agent, in which the cationically modified silica satisfies the following relational expression (1):

[Mathematical formula 6]

$$X<Y \qquad \text{relational expression (1)}$$

in the formula (1), X is a pH value at which an isoelectric point is shown in a cationically modified silica, and Y is a pH value of a cationically modified silica.

In the present embodiment, the descriptions of "silica raw material", "silane coupling agent", "mixing and reaction of the silica raw material and the silane coupling agent", and "cationically modified silica" are the same as those of the first embodiment, and therefore, are omitted.

In the silica dispersion of the present embodiment, the concentration of the cationically modified silica particles contained in the cationically modified silica is not particularly limited, and preferably 5% by mass or more, more preferably 10 to 50% by mass, and furthermore preferably 10 to 40% by mass. Meanwhile, in the cationically modified silica dispersion, the remainder excluding the content of the cationically modified silica is water or the like as a dispersing medium, an extremely minute amount of catalyst, or the like. In consideration of the range of the concentration of the cationically modified silica particles as described above, the concentration of the dispersing medium in the cationically modified silica dispersion is preferably 90% by mass or less, more preferably 50 to 90% by mass, and furthermore preferably 60 to 90% by mass. Further, the content of the organic solvent in the dispersing medium is also preferably as small as possible from the viewpoint that the organic solvent is required to be removed depending on the use application, and from this point of view, the proportion of the content of water when the total amount of the dispersing medium is taken as 100% by mass is preferably 90% by mass or more, more preferably 95% by mass or more, furthermore preferably 98% by mass or more, and still furthermore preferably 100% by mass. In this regard, in a case where the dispersing medium contains an organic solvent, such as an organic solvent, for example, the above-described organic solvents such as methanol, ethanol, and isopropanol are mentioned.

The cationically modified silica dispersion according to the present invention can be used for various applications of a polishing agent (abrasive grains) contained in a polishing composition, a paper coating agent, and the like, and exerts an excellent effect capable of performing stable dispersion for a long period of time in a wide pH range (in particular, even under an acidic condition).

Third Embodiment

The third embodiment of the present invention is a method for producing a polishing composition containing a cationically modified silica and a dispersing medium, including: preparing the cationically modified silica by mixing a silica raw material having a negative zeta potential with a silane coupling agent having an amino group or a quaternary cationic group, and reacting the silica raw material with the silane coupling agent; and then mixing the cationically modified silica and the dispersing medium, in which the cationically modified silica and the polishing composition satisfy the following relational expression (2):

[Mathematical formula 7]

$$Z<X<Y \qquad \text{relational expression (2)}$$

in the relational expression (2), X is a pH value at which an isoelectric point is shown in a cationically modified silica, Y is a pH value of a cationically modified silica, and Z is a pH value of a polishing composition.

In the present embodiment, the descriptions of "silica raw material", "silane coupling agent", "mixing and reaction of the silica raw material and the silane coupling agent", and "cationically modified silica" are the same as those of the first embodiment, and therefore, are omitted.

[Polishing Composition]

The polishing composition obtained by the production method of the third embodiment of the present invention contains a cationically modified silica and a dispersing medium, and a pH value X at which an isoelectric point is shown in a cationically modified silica, a pH value Y of a cationically modified silica, and a pH value Z of a polishing composition satisfy Z<X<Y (relational expression (2)). By having such a constitution, the polishing composition according to the present invention can suppress the generation of precipitation at the time of the production or after the production.

The polishing composition of the present embodiment contains a cationically modified silica, and a pH value X at which an isoelectric point is shown in the cationically modified silica and a pH value Y of the cationically modified silica satisfy X<Y (relational expression (1)). As described above in the first embodiment, by using a silica raw material having a negative zeta potential, and by adjusting the amount of a silane coupling agent to be added, the X and Y can satisfy the relational expression X<Y. Accordingly, the gelation of the cationically modified silica can be suppressed.

In the polishing composition of the present embodiment, it is considered that when the polishing composition is prepared by using the above-described cationically modified silica, if the pH value Z of the polishing composition approaches the same value as the pH value X that is an isoelectric point of the cationically modified silica, the absolute value of the zeta potential of the cationically modified silica approaches zero. Accordingly, it is considered that the cationically modified silica tends to be easily aggregated and becomes unstable, and the precipitation is generated in the polishing composition.

In contrast, when the pH value Z of the polishing composition and the above-described X and Y satisfy Z<X<Y (relational expression (2)), the positive absolute value of the zeta potential of the cationically modified silica can be increased in the polishing composition (as described above, the zeta potential of the cationically modified silica becomes a positive value under the acidic condition with a value lower than X). Accordingly, it is considered that the cationically modified silica can be stably dispersed in a composition, and therefore, the generation of precipitation can be suppressed.

The mechanism is based on speculation, and the correct or incorrect does not affect the technical scope of the present invention.

In the present embodiment, the polishing composition is not particularly limited, and can be obtained by mixing (preferably stirring and mixing) a cationically modified silica with a dispersing medium to be described later, and by adding a pH adjusting agent, other components, and the like, if necessary.

The temperature at which each component is mixed is not particularly limited, and preferably 10 to 40° C., and the heating may be performed to increase the rate of dissolution.

Further, the mixing time is not particularly limited.

In the production method of the present embodiment, the pH value Z of the polishing composition can be appropriately adjusted according to the usage form of the polishing composition as long as the value Z satisfies the above-described relational expression (2). The lower limit of Z is preferably 1.0 or more. The upper limit of Z is, for example, 9.0 or less, and preferably 8.5 or less.

In the production method of the present embodiment, the X and Z are not particularly limited as long as they satisfy the above-described relational expression (2). The X and Z satisfy, for example, X−Z≥0.5, and from the viewpoint of the stability (suppression of precipitation) of the polishing composition, satisfy preferably X−Z≥1.0.

In a preferred embodiment, from the viewpoint of the stability (suppression of precipitation) at the time of cationic modification and at the time of the polishing composition, the X is 5.0 or more and 10.0 or less.

(Dispersing Medium)

The polishing composition of the present embodiment contains a dispersing medium. As the dispersing medium, it is preferred to contain water. Further, from the viewpoint of preventing the influence of impurities on other components of the polishing composition, it is preferred to use water with high purity as much as possible. Specifically, pure water, ultrapure water, or distilled water, which is obtained by removing impurity ions with an ion exchange resin and then removing foreign matters through a filter, is preferred. In addition, as the dispersing medium, for the purpose of controlling the dispersibility of other components of the polishing composition, or the like, an organic solvent or the like may be further contained.

(pH Adjusting Agent)

In a preferred embodiment of the production method of the present embodiment, the mixing of the cationically modified silica and a pH adjusting agent is further included after the preparation of the cationically modified silica.

As the pH adjusting agent, it is not particularly limited, and an acid as described below can be used.

As the acid, an organic acid, an inorganic acid, or the like can be mentioned. Examples of the organic acid include an carboxylic acid such as formic acid, acetic acid, propionic acid, butyric acid, valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellitic acid, cinnamic acid, oxalic acid, malonic acid, succinic acid, glutaric acid, adipic acid, fumaric acid, maleic acid, aconitic acid, amino acid, nitro carboxylic acid; and a sulfonic acid such as methanesulfonic acid, ethanesulfonic acid, benzenesulfonic acid, p-toluenesulfonic acid, 10-camphorsulfonic acid, isethionic acid, and taurine. Further, examples of the inorganic acid include carbonic acid, hydrochloric acid, nitric acid, phosphoric acid, hypophosphorous acid, phosphorous acid, phosphonic acid, sulfuric acid, boric acid, hydrofluoric acid, orthophosphoric acid, pyrophosphoric acid, polyphosphoric acid, metaphosphoric acid, and hexametaphosphoric acid.

These pH adjusting agents may be used alone or by mixing two or more kinds thereof. As the pH adjusting agent, an inorganic acid is preferred, and among the inorganic acids, hydrochloric acid is more preferred.

The amount of the pH adjusting agent to be added is not particularly limited, and may be appropriately selected such that the pH is in the range in which the relational expression (2) of present embodiment is satisfied.

As the method for mixing the cationically modified silica and the pH adjusting agent, it is not particularly limited, and, for example, a method in which a cationically modified silica and a pH adjusting agent are stirred and mixed can be used. Further, in the mixing, in order to shorten the time taken for achieving the pH value of the polishing composition at the time of production to be a value close to the pH value X at which an isoelectric point is shown in the cationically modified silica, it is preferred to adjust the pH of the polishing composition promptly.

(Other Components)

Into the polishing composition of the present embodiment, an antiseptic agent, an antifungal agent, an anticorrosive, an antifoaming agent, a chelating agent, and the like may be added, if necessary, within the range not inhibiting the effects of the present invention. Examples of the antiseptic agent and antifungal agent include an isothiazoline-based antiseptic agent such as 2-methyl-4-isothiazolin-3-one, and 5-chloro-2-methyl-4-isothiazolin-3-one; paraoxybenzoic acid esters; phenoxyethanol; and the like, but the antiseptic agent and antifungal agent are not limited thereto. The antiseptic agent, the antifungal agent, the anticorrosive, the antifoaming agent, the chelating agent and the like may be used alone or in combination of two or more kinds thereof.

(Object to be Polished)

As the object to be polished of the polishing composition of the present embodiment, it is not particularly limited, and a silicon-containing material, various kinds of metal materials and the like can be mentioned.

Examples of the silicon-containing material include an object to be polished having a silicon-oxygen bond, such as a silicon oxide film, BD (black diamond: SiOCH), FSG (fluorosilicate glass), HSQ (hydrogen silsesquioxane), CYCLOTENE (benzocyclobutene resin), SiLK (hydrogenated silsesquioxane), and MSQ (methyl silsesquioxane); an object to be polished having a silicon-nitrogen bond, such as a silicon nitride film, and SiCN (silicon carbonitride); an object to be polished having a silicon-silicon bond, such as polysilicon, amorphous silicon, single crystal silicon, n-type doped single crystal silicon, and p-type doped single crystal silicon; and the like. Examples of the various kinds of metal materials include copper, aluminum, hafnium, cobalt, nickel, titanium, tungsten, and the like.

Fourth Embodiment

The fourth embodiment of the present invention is a polishing composition, including: a cationically modified silica obtained by mixing a silica raw material having a negative zeta potential with a silane coupling agent having an amino group or a quaternary cationic group, and reacting the silica raw material with the silane coupling agent; and a dispersing medium, in which the cationically modified silica and the polishing composition satisfy the following relational expression (2):

[Mathematical formula 8]

$$Z < X < Y \qquad \text{relational expression (2)}$$

in the relational expression (2), X is a pH value at which an isoelectric point is shown in a cationically modified silica, Y is a pH value of a cationically modified silica, and Z is a pH value of a polishing composition. By having such a constitution, the generation of precipitation can be suppressed.

In a preferred embodiment, the polishing composition further includes a pH adjusting agent from the viewpoint of more suppressing the generation of precipitation.

In the present embodiment, the descriptions of "silica raw material", "silane coupling agent", "mixing and reaction of the silica raw material and the silane coupling agent", and "cationically modified silica" are the same as those of the first embodiment, and the description of "polishing composition" in the present embodiment is the same as that of the third embodiment, and therefore, these descriptions are omitted.

EXAMPLES

The present invention will be described in more detail by way of the following Examples and Comparative Examples. However, the technical scope of the present invention is not limited only to the following Examples. Further, in the following Examples, operations were performed under the conditions of room temperature (25° C.) and a relative humidity of 40 to 50% RH, unless otherwise noted.

[Measurement Method of Various Physical Properties]

In the present Examples, various physical properties were measured by the following technique.

<Measurement of Particle Size>

As the value of average secondary particle size of the silica particles contained in a silica dispersion, a value measured as a volume average particle size by a dynamic light scattering method using a particle size distribution measuring device (UPA-UT151, manufactured by NIKKISO CO., LTD.) was adopted (described as "Mv (UPA)" in the following Tables 1 and 2). Further, the value of average primary particle size of the silica particles contained in a silica dispersion was calculated by using the formula of $SA=4\pi R^2$, assuming that the shape of the silica particle is a perfect sphere, on the basis of the specific surface area (SA) of the silica particle calculated by a BET method. In this regard, the value of the degree of association (average secondary particle size/average primary particle size) was also calculated from these values. In the following Tables 1 and 2, only the average secondary particle size and the degree of association are described.

<Measurement of Zeta Potential>

The zeta potential of each of a silica raw material and the obtained cationically modified silica dispersion was measured by using a zeta potential measurement device (trade name "ELS-Z") manufactured by Otsuka Electronics Co., Ltd. In this regard, the zeta potential of the silica raw material was measured without adjusting the pH particularly. Meanwhile, the zeta potential of the cationically modified silica dispersion was measured after the pH was adjusted to a value corresponding to an isoelectric point of the corresponding silica raw material by using hydrochloric acid as a pH adjusting agent.

<Measurement of pH>

The pH of each of a silica raw material, the obtained cationically modified silica dispersion, and the obtained polishing composition was confirmed by a pH meter (model number: F-71 manufactured by HORIBA Ltd.). The pH of each of the cationically modified silica dispersion and the polishing composition was a value obtained by the measurement immediately after the preparation of each of them.

In the following Tables 1 and 2, in a case where gelation or precipitation was confirmed in the middle of obtaining the cationically modified silica or immediately after the cationically modified silica was obtained, the pH value immediately before the gelation or precipitation was described.

<Calculation of pH to be Isoelectric Point>

The zeta potential of the cationically modified silica was measured with 1.0 increments from pH 2.0 to 10.0, and the pH at which an isoelectric point was shown in the obtained cationically modified silica dispersion (pH of the isoelectric point) was calculated from the pH values before and after the sign of the zeta potential changed, and the zeta potentials at the pH values before and after the sign of the zeta potential changed, by the following formula.

[Mathematical formula 9]

$$\text{pH of isoelectric point} = \frac{\alpha \times \zeta_\beta - \beta \times \zeta_\alpha}{\zeta_\beta - \zeta_\alpha}$$

α and β: pH values before and after sign of zeta potential changed (α<β)
$\zeta_\alpha$: zeta potential at pH value α
$\zeta_\beta$: zeta potential at pH value β
In the following Tables 1 and 2, the pH value at which an isoelectric point was shown in the obtained cationically modified silica dispersion (described as "pH X of isoelectric point" in the following Tables 1 and 2) was only described.

<Confirmation of Presence or Absence of Gelation>

With respect to the obtained cationically modified silica dispersion, the presence or absence of the gelation or precipitation in the middle of obtaining the cationically modified silica dispersion (during the reaction) or immediately after the cationically modified silica dispersion was obtained (after the reaction) by mixing a silica raw material with a coupling agent using the method described in each of Examples and Comparative Examples was visually confirmed. Further, similarly, the presence or absence of the gelation was visually confirmed also immediately after a high temperature acceleration test in which the obtained cationically modified silica dispersion was left to stand under the temperature condition of 70° C. for 2 weeks.

<Confirmation of Presence or Absence of Precipitation>

With respect to the obtained polishing composition, the polishing composition was prepared by the method described in each of Examples and Comparative Examples, and then the prepared polishing composition was left to stand for 1 hour, and the presence or absence of precipitation was visually confirmed.

Example 1

A colloidal silica being a silica raw material (water dispersion having a concentration of silica particles of 48% by mass, an average secondary particle size of 33 nm, a degree of association of 1.3, and a pH of isoelectric point of around 3) was prepared. When the zeta potential of the colloidal silica was measured, −55.4 mV was obtained.

To the colloidal silica prepared in the above, γ-aminopropyltriethoxysilane (hereinafter, also referred to as "APES") was added dropwise as it was without being diluted at a dropping speed of 5 mL/min while stirring at a stirring speed of 600 rpm. In this regard, the amount of the APES to be added was adjusted so as to be 0.5% by mass relative to 100% by mass of the silica particles contained in the silica raw material.

After that, a cationically modified (amino-modified) silica dispersion (pH 9.4) in which an amino group was introduced to a surface of the silica particle was obtained while maintaining the stirring state for 3 hours at room temperature without heating the reaction system.

In the obtained cationically modified silica dispersion, the pH at which an isoelectric point is shown in the cationically modified silica is 5.5, and the zeta potential (at pH 3) was +24.8 mV.

In the obtained cationically modified silica dispersion, gelation and precipitation were not confirmed during the reaction, after the reaction, and immediately after the high temperature acceleration test.

Example 2

A cationically modified (amino-modified) silica dispersion (pH 10.1) was produced by using a similar technique as in Example 1 except that the amount of the APES to be added was changed to 2.0% by mass relative to 100% by mass of the silica particles contained in the silica raw material.

In the obtained cationically modified silica dispersion, the pH at which an isoelectric point was shown in the cationically modified silica was 7.1, and the zeta potential (at pH 3) was +48.2 mV.

In the obtained cationically modified silica dispersion, gelation and precipitation were not confirmed during the reaction, after the reaction, and immediately after the high temperature acceleration test.

Comparative Example 1

With respect to the colloidal silica prepared in Example 2, the pH of the dispersion liquid was adjusted to 2 by using 1M HCl.

After that, by using a similar technique as in the above-described technique of Example 2, when trying to produce a cationically modified (amino-modified) silica dispersion, gelation was confirmed during the reaction. At this time, the pH immediately before the gelation was 6.4.

Example 3

A cationically modified (amino-modified) silica dispersion (pH 10.9) was produced by using a similar technique as in Example 1 except that the amount of the APES to be added was changed to 5.0% by mass relative to 100% by mass of the silica particles contained in the silica raw material.

In the obtained cationically modified silica dispersion, the pH at which an isoelectric point was shown in the cationically modified silica was 8.5, and the zeta potential (at pH 3) was +55.3 mV.

In the obtained cationically modified silica dispersion, gelation and precipitation were not confirmed during the reaction and after the reaction. However, gelation was confirmed immediately after the high temperature acceleration test.

Example 4

A colloidal silica being a silica raw material (water dispersion having a concentration of silica particles of 30% by mass, an average secondary particle size of 33 nm, a degree of association of 1.3, and a pH of isoelectric point of around 3) was prepared. When the zeta potential of the colloidal silica was measured, −54.6 mV was obtained.

To the colloidal silica prepared in the above, APES was added dropwise as it was without being diluted at a dropping speed of 5 mL/min while stirring at a stirring speed of 600 rpm. In this regard, the amount of the APES to be added was adjusted so as to be 2.0% by mass relative to 100% by mass of the silica particles contained in the silica raw material.

After that, a cationically modified (amino-modified) silica dispersion (pH 10.0) in which an amino group was introduced to a surface of the silica particle was obtained while maintaining the stirring state for 3 hours at room temperature without heating the reaction system.

In the obtained cationically modified silica dispersion, the pH at which an isoelectric point was shown in the cationically modified silica was 6.7, and the zeta potential (at pH 3) was +46.0 mV.

In the obtained cationically modified silica dispersion, gelation and precipitation were not confirmed during the reaction, after the reaction, and immediately after the high temperature acceleration test.

Example 5

A cationically modified (amino-modified) silica dispersion (pH 10.9) was produced by using a similar technique as in Example 4 except that the amount of the APES to be added was changed to 5.0% by mass relative to 100% by mass of the silica particles contained in the silica raw material.

In the obtained cationically modified silica dispersion, the pH at which an isoelectric point was shown in the cationically modified silica was 8.3, and the zeta potential (at pH 3) was +50.8 mV.

In the obtained cationically modified silica dispersion, gelation and precipitation were not confirmed during the reaction, after the reaction, and immediately after the high temperature acceleration test.

Example 6

A cationically modified (amino-modified) silica dispersion (pH 11.4) was produced by using a similar technique as in Example 4 except that the amount of the APES to be added was changed to 7.5% by mass relative to 100% by mass of the silica particles contained in the silica raw material.

In the obtained cationically modified silica dispersion, the pH at which an isoelectric point was shown in the cationically modified silica was 9.3, and the zeta potential (at pH 3) was +49.4 mV.

In the obtained cationically modified silica dispersion, gelation and precipitation were not confirmed during the reaction and after the reaction. However, gelation was confirmed immediately after the high temperature acceleration test.

Example 7

A colloidal silica being a silica raw material (water dispersion having a concentration of silica particles of 10% by mass, an average secondary particle size of 33 nm, a degree of association of 1.3, and a pH of isoelectric point of around 3) was prepared. When the zeta potential of the colloidal silica was measured, −53.4 mV was obtained.

To the colloidal silica prepared in the above, APES was added dropwise as it was without being diluted at a dropping speed of 5 mL/min while stirring at a stirring speed of 600 rpm. In this regard, the amount of the APES to be added was adjusted so as to be 5.0% by mass relative to 100% by mass of the silica particles contained in the silica raw material.

After that, a cationically modified (amino-modified) silica dispersion (pH 10.7) in which an amino group was introduced to a surface of the silica particle was obtained while maintaining the stirring state for 3 hours at room temperature without heating the reaction system.

In the obtained cationically modified silica dispersion, the pH at which an isoelectric point was shown in the cationically modified silica was 8.6, and the zeta potential (at pH 3) was +55.3 mV.

In the obtained cationically modified silica dispersion, gelation and precipitation were not confirmed during the reaction, after the reaction, and immediately after the high temperature acceleration test.

Example 8

A high-purity colloidal silica being a silica raw material (water dispersion having a concentration of silica particles of 20% by mass, an average secondary particle size of 57 nm, a degree of association of 1.6, and a pH of isoelectric point of around 4) was prepared. When the zeta potential of the colloidal silica was measured, −45.6 mV was obtained.

To the colloidal silica prepared in the above, APES was added dropwise as it was without being diluted at a dropping speed of 5 mL/min while stirring at a stirring speed of 600 rpm. In this regard, the amount of the APES to be added was adjusted so as to be 0.1% by mass relative to 100% by mass of the silica particles contained in the silica raw material.

After that, a cationically modified (amino-modified) silica dispersion (pH 7.6) in which an amino group was introduced to a surface of the silica particle was obtained while maintaining the stirring state for 3 hours at room temperature without heating the reaction system.

In the obtained cationically modified silica dispersion, the pH at which an isoelectric point was shown in the cationically modified silica was 5.4, and the zeta potential (at pH 4) was +39.3 mV.

In the obtained cationically modified silica dispersion, gelation and precipitation were not confirmed during the reaction, after the reaction, and immediately after the high temperature acceleration test.

Example 9

A cationically modified (amino-modified) silica dispersion (pH 8.0) was produced by using a similar technique as in Example 8 except that the amount of the APES to be added was changed to 1.0% by mass relative to 100% by mass of the silica particles contained in the silica raw material.

In the obtained cationically modified silica dispersion, the pH at which an isoelectric point was shown in the cationically modified silica was 6.9, and the zeta potential (at pH 4) was +52.1 mV.

In the obtained cationically modified silica dispersion, gelation and precipitation were not confirmed during the reaction, after the reaction, and immediately after the high temperature acceleration test.

Comparative Example 2

With respect to the high-purity colloidal silica prepared in Example 8, the pH of the dispersion liquid was adjusted to 2 by using 1M HCl.

After that, by using a similar technique as in the above-described technique of Example 12, when trying to produce a cationically modified (amino-modified) silica dispersion, gelation was confirmed during the reaction. At this time, the pH immediately before the gelation was 6.5.

Example 10

A high-purity colloidal silica being a silica raw material (water dispersion having a concentration of silica particles of 10% by mass, an average secondary particle size of 57 nm, a degree of association of 1.6, and a pH of isoelectric point of around 4) was prepared. When the zeta potential of the colloidal silica was measured, −50.2 mV was obtained.

To the colloidal silica prepared in the above, APES was added dropwise as it was without being diluted at a dropping speed of 5 mL/min while stirring at a stirring speed of 600 rpm. In this regard, the amount of the APES to be added was adjusted so as to be 2.5% by mass relative to 100% by mass of the silica particles contained in the silica raw material.

After that, a cationically modified (amino-modified) silica dispersion (pH 8.7) in which an amino group was introduced to a surface of the silica particle was obtained while maintaining the stirring state for 3 hours at room temperature without heating the reaction system.

In the obtained cationically modified silica dispersion, the pH at which an isoelectric point was shown in the cationically modified silica was 8.0, and the zeta potential (at pH 4) was +61.0 mV.

In the obtained cationically modified silica dispersion, gelation and precipitation were not confirmed during the reaction and after the reaction. However, gelation was confirmed immediately after the high temperature acceleration test.

Example 11

A cationically modified (amino-modified) silica dispersion (pH 10.1) was produced by using a similar technique as in Example 10 except that the pH of the dispersion liquid was adjusted to 10 by using a 29% by mass ammonia aqueous solution in the high-purity colloidal silica prepared in Example 10.

In the obtained cationically modified silica dispersion, the pH at which an isoelectric point was shown in the cationically modified silica was 8.2, and the zeta potential (at pH 4) was +62.8 mV.

In the obtained cationically modified silica dispersion, gelation and precipitation were not confirmed during the reaction, after the reaction, and immediately after the high temperature acceleration test.

Example 12

A colloidal silica being a silica raw material (water dispersion having a concentration of silica particles of 40% by mass, an average secondary particle size of 97 nm, a degree of association of 1.2, and a pH of isoelectric point of around 3) was prepared. When the zeta potential of the colloidal silica was measured, −57.8 mV was obtained.

To the colloidal silica prepared in the above, APES was added dropwise as it was without being diluted at a dropping speed of 5 mL/min while stirring at a stirring speed of 600 rpm. In this regard, the amount of the APES to be added was adjusted so as to be 0.5% by mass relative to 100% by mass of the silica particles contained in the silica raw material.

After that, a cationically modified (amino-modified) silica dispersion (pH 10.3) in which an amino group was introduced to a surface of the silica particle was obtained while maintaining the stirring state for 3 hours at room temperature without heating the reaction system.

In the obtained cationically modified silica dispersion, the pH at which an isoelectric point was shown in the cationically modified silica was 6.5, and the zeta potential (at pH 3) was +57.2 mV.

In the obtained cationically modified silica dispersion, gelation and precipitation were not confirmed during the reaction, after the reaction, and immediately after the high temperature acceleration test.

Example 13

A cationically modified (amino-modified) silica dispersion (pH 10.7) was produced by using a similar technique as in Example 12 except that the amount of the APES to be added was changed to 1.0% by mass relative to 100% by mass of the silica particles contained in the silica raw material.

In the obtained cationically modified silica dispersion, the pH at which an isoelectric point was shown in the cationically modified silica was 7.5, and the zeta potential (at pH 3) was +50.3 mV.

In the obtained cationically modified silica dispersion, gelation and precipitation were not confirmed during the reaction, after the reaction, and immediately after the high temperature acceleration test.

Comparative Example 3

With respect to the colloidal silica prepared in Example 12, the pH of the dispersion liquid was adjusted to 2 by using 1M HCl. After that, by using a similar technique as in the above-described technique of Example 19, when trying to produce a cationically modified (amino-modified) silica dispersion, gelation was confirmed during the reaction. At this time, the pH immediately before the gelation was 7.0.

Example 14

A cationically modified (amino-modified) silica dispersion (pH 11.4) was produced by using a similar technique as in Example 12 except that the amount of the APES to be added was changed to 3.0% by mass relative to 100% by mass of the silica particles contained in the silica raw material.

In the obtained cationically modified silica dispersion, the pH at which an isoelectric point was shown in the cationically modified silica was 8.9, and the zeta potential (at pH 3) was +46.6 mV.

In the obtained cationically modified silica dispersion, gelation and precipitation were not confirmed during the reaction, after the reaction, and immediately after the high temperature acceleration test.

Example 15

The cationically modified silica dispersion prepared in Example 1 was diluted and mixed with pure water such that the concentration of silica particles was 1% by mass, and the pH was adjusted with 1 M hydrochloric acid to obtain a polishing composition (pH 4.5).

In the obtained polishing composition, gelation and precipitation were not confirmed.

Comparative Example 4

The cationically modified silica dispersion prepared in Example 1 was diluted and mixed with pure water such that the concentration of silica particles was 1% by mass, and the pH was adjusted with 1 M hydrochloric acid to obtain a polishing composition (pH 5.5).

In the obtained polishing composition, precipitation was confirmed.

Example 16

The cationically modified silica dispersion prepared in Example 6 was diluted and mixed with pure water such that the concentration of silica particles was 1% by mass, and the pH was adjusted with 1 M hydrochloric acid to obtain a polishing composition (pH 8.3).

In the obtained polishing composition, gelation and precipitation were not confirmed.

Comparative Example 5

The cationically modified silica dispersion prepared in Example 6 was diluted and mixed with pure water such that the concentration of silica particles was 1% by mass, and the pH was adjusted with 1 M hydrochloric acid to obtain a polishing composition (pH 9.3).
In the obtained polishing composition, precipitation was confirmed.

Example 17

The cationically modified silica dispersion prepared in Example 9 was diluted and mixed with pure water such that the concentration of silica particles was 1% by mass, and the pH was adjusted with 1 M hydrochloric acid to obtain a polishing composition (pH 5.9).
In the obtained polishing composition, gelation and precipitation were not confirmed.

Comparative Example 6

The cationically modified silica dispersion prepared in Example 9 was diluted and mixed with pure water such that the concentration of silica particles was 1% by mass, and the pH was adjusted with 1 M hydrochloric acid to obtain a polishing composition (pH 6.9).
In the obtained polishing composition, precipitation was confirmed.

Example 18

The cationically modified silica dispersion prepared in Example 12 was diluted and mixed with pure water such that the concentration of silica particles was 1% by mass, and the pH was adjusted with 1 M hydrochloric acid to obtain a polishing composition (pH 5.5).
In the obtained polishing composition, gelation and precipitation were not confirmed.

Comparative Example 7

The cationically modified silica dispersion prepared in Example 12 was diluted and mixed with pure water such that the concentration of silica particles was 1% by mass, and the pH was adjusted with 1 M hydrochloric acid to obtain a polishing composition (pH 6.5).
In the obtained polishing composition, precipitation was confirmed.

TABLE 1

| | Mv (UPA) [nm] | Degree of association | Concentration of silica particles [% by mass] | Concentration of coupling agent (to silica particles) [% by mass] | Zeta potential after modification at pH 4 or pH 3 [mV] | pH X of isoelectric point | pH Y after cationic modification | Gelation During/after reaction | Gelation Immediately after high temperature acceleration test |
|---|---|---|---|---|---|---|---|---|---|
| Example 1 | 33 | 1.3 | 48 | 0.5 | 24.8 | 5.5 | 9.4 | Absence | Absence |
| Example 2 | 33 | 1.3 | 48 | 2.0 | 48.2 | 7.1 | 10.1 | Absence | Absence |
| Comparative Example 1 | 33 | 1.3 | 48 | 2.0 | — | 7.1 | 6.4 | Presence | — |
| Example 3 | 33 | 1.3 | 48 | 5.0 | 55.3 | 8.5 | 10.9 | Absence | Presence |
| Example 4 | 33 | 1.3 | 30 | 2.0 | 46.0 | 6.7 | 10.0 | Absence | Absence |
| Example 5 | 33 | 1.3 | 30 | 5.0 | 50.8 | 8.3 | 10.9 | Absence | Absence |
| Example 6 | 33 | 1.3 | 30 | 7.5 | 49.4 | 9.3 | 11.4 | Absence | Presence |
| Example 7 | 33 | 1.3 | 10 | 5.0 | 55.3 | 8.6 | 10.7 | Absence | Absence |
| Example 8 | 57 | 1.6 | 20 | 0.1 | 39.3 | 5.4 | 7.6 | Absence | Absence |
| Example 9 | 57 | 1.6 | 20 | 1.0 | 52.1 | 6.9 | 8.0 | Absence | Absence |
| Comparative Example 2 | 57 | 1.6 | 20 | 1.0 | — | 6.9 | 6.5 | Presence | — |
| Example 10 | 57 | 1.6 | 10 | 2.5 | 61.0 | 8.0 | 8.7 | Absence | Presence |
| Example 11 | 57 | 1.6 | 10 | 2.5 | 62.8 | 8.2 | 10.1 | Absence | Absence |
| Example 12 | 97 | 1.2 | 40 | 0.5 | 57.2 | 6.5 | 10.3 | Absence | Absence |
| Example 13 | 97 | 1.2 | 40 | 1.0 | 50.3 | 7.5 | 10.7 | Absence | Absence |
| Comparative Example 3 | 97 | 1.2 | 40 | 1.0 | — | 7.5 | 7.0 | Presence | — |
| Example 14 | 97 | 1.2 | 40 | 3.0 | 46.6 | 8.9 | 11.4 | Absence | Absence |

TABLE 2

| | Mv (UPA) [um] | Degree of association | Concentration of silica particles [% by mass] | Concentration of coupling agent (to silica particles) [% by mass] | Zeta potential after modification at pH 4 or pH 3 [mV] | pH X of isoelectric point | pH Y after cationic modification | pH Z at polishing composition | Precipitation |
|---|---|---|---|---|---|---|---|---|---|
| Example 15 | 33 | 1.3 | 48 | 0.5 | 24.8 | 5.5 | 9.4 | 4.5 | Absence |
| Comparative Example 4 | 33 | 1.3 | 48 | 0.5 | 24.8 | 5.5 | 9.4 | 5.5 | Presence |
| Example 16 | 33 | 1.3 | 30 | 7.5 | 49.4 | 9.3 | 11.4 | 8.3 | Absence |
| Comparative Example 5 | 33 | 1.3 | 30 | 7.5 | 49.4 | 9.3 | 11.4 | 9.3 | Presence |
| Example 17 | 57 | 1.6 | 20 | 1.0 | 52.1 | 6.9 | 8.0 | 5.9 | Absence |

TABLE 2-continued

| | Mv (UPA) [um] | Degree of association | Concentration of silica particles [% by mass] | Concentration of coupling agent (to silica particles) [% by mass] | Zeta potential after modification at pH 4 or pH 3 [mV] | pH X of isoelectric point | pH Y after cationic modification | pH Z at polishing composition Precipitation | Precipitation |
|---|---|---|---|---|---|---|---|---|---|
| Comparative Example 6 | 57 | 1.6 | 20 | 1.0 | 52.1 | 6.9 | 8.0 | 6.9 | Presence |
| Example 18 | 97 | 1.2 | 40 | 0.5 | 57.2 | 6.5 | 10.3 | 5.5 | Absence |
| Comparative Example 7 | 97 | 1.2 | 40 | 0.5 | 57.2 | 6.5 | 10.3 | 6.5 | Presence |

As shown in Table 1, in a case of Examples, it can be understood that when a pH value X at which an isoelectric point is shown in a cationically modified silica and a pH value Y of a cationically modified silica satisfy the relational expression X<Y (relational expression (1)), gelation has not been generated during the reaction or immediately after the reaction. In contrast, in a case of Comparative Examples, it can be understood that since the X and Y do not satisfy the relational expression X<Y (relational expression (1)), gelation has been generated during the reaction or immediately after the reaction.

As shown in Table 2, in a case of Examples, it can be understood that when a pH value X at which an isoelectric point is shown in a cationically modified silica, a pH value Y of a cationically modified silica, and a pH value Z of a polishing composition satisfy the relational expression Z<X<Y (relational expression (2)), precipitation has not been generated in the polishing composition. In contrast, in a case of Comparative Examples, it can be understood that since the X and Z are X Z, precipitation has been generated in the polishing composition.

The present application is based on Japanese Patent Application No. 2016-193604, filed with the Japan Patent Office on Sep. 30, 2016, the entire content of which is hereby incorporated by reference.

The invention claimed is:

1. A method for producing a cationically modified silica, comprising:
mixing a silica raw material having a negative zeta potential with a silane coupling agent having an amino group or a quaternary cationic group; and reacting the silica raw material with the silane coupling agent to obtain a cationically modified silica,
wherein the silica raw material is produced by a sol-gel method; and
wherein the cationically modified silica satisfies the following relational expression (1):

$$X<Y \quad (1)$$

wherein X is a pH value at which an isoelectric point is shown in the cationically modified silica, and Y is a pH value of the cationically modified silica immediately after preparation of the cationically modified silica.

2. The method for producing a cationically modified silica according to claim 1, further comprising, adjusting a zeta potential of the silica raw material to the negative value before the reaction.

3. The method for producing a cationically modified silica according to claim 1, wherein a zeta potential of the silica raw material immediately before the reaction is −10 mV or less.

4. The method for producing a cationically modified silica according to claim 1, wherein in the mixing, the silane coupling agent is used without being diluted, or used in a state of a solution having a concentration of 5% by mass or more.

5. The method for producing a cationically modified silica according to claim 1, wherein an amount of the silane coupling agent is 0.05% by mass or more relative to 100% by mass of silica particles contained in the silica raw material.

6. The method for producing a cationically modified silica according to claim 1, wherein the silane coupling agent is a primary amine/ethoxy coupling agent.

7. The method for producing a cationically modified silica according to claim 1, wherein a step of heating a reaction system of the silica raw material and the silane coupling agent is not included.

8. A cationically modified silica dispersion, being obtained by mixing a silica raw material having a negative zeta potential with a silane coupling agent having an amino group or a quaternary cationic group, and reacting the silica raw material with the silane coupling agent,
wherein the silica raw material is produced by a sol-gel method; and
wherein the cationically modified silica satisfies the following relational expression (1):

$$X<Y \quad (1)$$

wherein X is a pH value at which an isoelectric point is shown in the cationically modified silica, and Y is a pH value of the cationically modified silica immediately after preparation of the cationically modified silica.

9. The cationically modified silica dispersion according to claim 8, which comprises the cationically modified silica in a concentration of 5% by mass or more.

10. A method for producing a polishing composition containing a cationically modified silica and a dispersing medium, comprising:
preparing the cationically modified silica by mixing a silica raw material having a negative zeta potential with a silane coupling agent having an amino group or a quaternary cationic group, and reacting the silica raw material with the silane coupling agent; and then
mixing the cationically modified silica and the dispersing medium,
wherein the silica raw material is produced by a sol-gel method; and
wherein the cationically modified silica and the polishing composition satisfy the following relational expression (2):

$$Z<X<Y \quad (2)$$

wherein X is a pH value at which an isoelectric point is shown in the cationically modified silica, Y is a pH value of the cationically modified silica immediately after preparation of the cationically modified silica, and Z is a pH value of the polishing composition.

11. The method for producing a polishing composition according to claim 10, further comprising, mixing the cationically modified silica and a pH adjusting agent after the preparation.

12. The method for producing a polishing composition according to claim 10, wherein the X is 5.0 or more and 10.0 or less.

13. A polishing composition, comprising:
a cationically modified silica obtained by mixing a silica raw material having a negative zeta potential with a silane coupling agent having an amino group or a quaternary cationic group, and reacting the silica raw material with the silane coupling agent; and a dispersing medium,
wherein the silica raw material is produced by a sol-gel method; and
wherein the cationically modified silica and the polishing composition satisfy the following relational expression (2):

$$Z<X<Y \tag{2}$$

wherein X is a pH value at which an isoelectric point is shown in the cationically modified silica, Y is a pH value of the cationically modified silica immediately after preparation of the cationically modified silica, and Z is a pH value of the polishing composition.

14. The polishing composition according to claim 13, further comprising a pH adjusting agent.

* * * * *